United States Patent
Kim et al.

(10) Patent No.: US 12,531,568 B2
(45) Date of Patent: Jan. 20, 2026

(54) DIGITAL NOISE COUPLING CIRCUIT AND CONTINUOUS TIME MODULATOR INCLUDING THE SAME

(71) Applicants: Samsung Electronics Co., Ltd., Suwon-si (KR); Korea Advanced Institute of Science and Technology, Daejeon (KR)

(72) Inventors: Seong Joong Kim, Suwon-si (KR); Seung Tak Ryu, Daejeon (KR); Kent Edrian Lozada, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 219 days.

(21) Appl. No.: 18/366,493

(22) Filed: Aug. 7, 2023

(65) Prior Publication Data
US 2024/0146322 A1 May 2, 2024

(30) Foreign Application Priority Data
Oct. 31, 2022 (KR) .......... 10-2022-0142915

(51) Int. Cl.
*H03M 1/06* (2006.01)
(52) U.S. Cl.
CPC ....... *H03M 1/0653* (2013.01); *H03M 1/0626* (2013.01); *H03M 1/0668* (2013.01)
(58) Field of Classification Search
CPC .......... H03M 1/0626; H03M 1/0668
USPC .......... 341/144, 155, 153, 118, 120
See application file for complete search history.

(56) References Cited

U.S. PATENT DOCUMENTS

| | | | |
|---|---|---|---|
| 7,736,336 B2* | 6/2010 | Plishka | A61B 17/3415 604/158 |
| 10,715,160 B1 | 7/2020 | Rajasekhar et al. | |
| 10,778,239 B2 | 9/2020 | Jang et al. | |
| 10,784,878 B1* | 9/2020 | Sukumaran | H03M 1/0604 |
| 11,967,967 B2* | 4/2024 | Liu | H03M 3/352 |
| 12,088,324 B2* | 9/2024 | Abdelaal | H03M 3/436 |
| 2011/0200077 A1* | 8/2011 | Mitani | H03M 3/388 341/143 |

(Continued)

FOREIGN PATENT DOCUMENTS

| | | |
|---|---|---|
| CN | 107222216 B | 5/2020 |
| KR | 10-1783181 B1 | 9/2017 |

OTHER PUBLICATIONS

Castello et al. "A High-Performance Micropower Switched-Capacitor Filter" *IEEE Journal of Solid-State Circuits*, vol. sc-20, No. 6, Dec. 1985 (pp. 1122-1132).

(Continued)

*Primary Examiner* — Peguy Jean Pierre
(74) *Attorney, Agent, or Firm* — NSIP Law (57) ABSTRACT

A digital noise coupling circuit includes: an analog-to-digital converter (ADC) configured to convert a quantization error, generated in a process of converting a first analog signal into a first digital signal, into a first digital error signal; a delay cell comprising delay elements configured to delay a transmission of the first digital error signal based on a clock signal; and a digital-to-analog (DA) conversion circuit configured to perform, in an analog domain, noise shaping on the first digital error signal that is delayed and transmitted from the delay cell.

21 Claims, 6 Drawing Sheets

(56) References Cited

U.S. PATENT DOCUMENTS

2018/0241409 A1* 8/2018 Dagher ................ H03M 3/396
2019/0372581 A1* 12/2019 Jang ..................... H03M 3/344
2021/0181247 A1 6/2021 Huynh et al.
2024/0057920 A1 2/2024 Koo et al.

OTHER PUBLICATIONS

Jang et al. "A 4.2-mW 10-MHz BW 74.4-dB SNDR Continuous-Time Delta-Sigma Modulator With SAR-Assisted Digital-Domain Noise Coupling" *IEEE Journal of Solid-State Circuits*, vol. 53, No. 4, Apr. 2018 (pp. 1139-1148).
Ryu et al. "A 10-bit 50-MS/s Pipelined ADC With Opamp Current Reuse" *IEEE Journal of Solid-State Circuits*, vol. 42, No. 3, Mar. 2007 (pp. 475-485).

* cited by examiner

DIGITAL NOISE COUPLING CIRCUIT AND CONTINUOUS TIME MODULATOR INCLUDING THE SAME

CROSS-REFERENCE TO RELATED APPLICATIONS

This application claims the benefit under 35 USC § 119(a) of Korean Patent Application No. 10-2022-0142915, filed on Oct. 31, 2022 in the Korean Intellectual Property Office, the entire disclosure of which is incorporated herein by reference for all purposes.

BACKGROUND

1. Field

The following description relates to a digital noise coupling circuit and a continuous time modulator including the digital noise coupling circuit.

2. Description of Related Art

Since mobile devices such as smartphones and/or tablet personal computers (PCs) are constructed in a small size for portability, they may include small-sized semiconductor devices. The mobile device may use, for example, a power supply device that may store limited power, such as a battery. Accordingly, the mobile device may be constructed to use an electronic circuit having a small size and consuming less power.

An analog-to-digital converter (ADC) and/or a digital-to-analog converter (DAC) may be one of essential components of mobile devices configured to process information using digital signals. However, it is difficult to construct a high-resolution ADC/DAC disposed in a small area and consuming low power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, a digital noise coupling circuit includes: an analog-to-digital converter (ADC) configured to convert a quantization error, generated in a process of converting a first analog signal into a first digital signal, into a first digital error signal; a delay cell comprising delay elements configured to delay a transmission of the first digital error signal based on a clock signal; and a digital-to-analog (DA) conversion circuit configured to perform, in an analog domain, noise shaping on the first digital error signal that is delayed and transmitted from the delay cell.

The DA conversion circuit may include: a second digital-to-analog converter (DAC) configured to convert a result of performing the noise shaping on the first digital error signal that is delayed and transmitted from the delay cell into a second analog signal; and an adder configured to add a difference between the second analog signal and a first analog error signal.

The DA conversion circuit may be configured to convert a signal obtained by attenuating signal components having frequencies less than or equal to a reference frequency among signal components comprised in the first digital error signal that is delayed into the second analog signal through an analog addition of a charge domain.

The DA conversion circuit may be implemented by a capacitive digital-to-analog converter (CDAC) configured to generate a second analog output voltage corresponding to the first digital error signal that is delayed, by performing the noise shaping through charge redistribution by capacitors connected to all bits from a most significant bit (MSB) to a least significant bit (LSB) of the first digital error signal that is delayed, according to a control voltage.

The DA conversion circuit may be configured to perform the noise shaping through the charge redistribution by the capacitors that are charged or discharged by switches that switch each of the capacitors based on the control voltage and a transfer function having a characteristic of a high-order high pass filter.

The transfer function may include either one or both of a characteristic of a second-order high pass filter and a characteristic of a third-order high pass filter.

The DA conversion circuit may include: a first noise coupling DAC block comprising a first group of switches and a first group of capacitors connected to a reference node; a second noise coupling DAC block comprising a second group of switches and a second group of capacitors connected to the reference node, and a third group of switches and a third group of capacitors connected to the reference node; a comparator configured to generate a comparison result by comparing a level of a voltage formed at the reference node to which the first group of capacitors, the second group of capacitors, and the third group of capacitors are connected with a level of a reference voltage; a logic circuit configured to generate a control signal such that a switch block comprising the first group of switches, the second group of switches, and the third group of switches connects each of the first group of capacitors, the second group of capacitors, and the third group of capacitors to one of a terminal of a non-inverting voltage and a terminal of an inverting voltage, based on the transfer function; and a sampler configured to sample a signal corresponding to the reference node based on the control signal of the logic circuit.

The logic circuit may be configured to generate a control signal to control the first group of switches, the second group of switches, and the third group of switches based on the comparison result received from the comparator.

The logic circuit may be configured to output a signal representing predetermined data based on a clock and the comparison result received from the comparator.

A ratio of capacitances of the first group of capacitors may be 64:32:16:8:4:2:1, and a ratio of capacitances of each of the second group of capacitors and the third group of capacitors may be 8:4:2:1.

The DA conversion circuit further may include a first DAC configured to convert the first digital error signal that is delayed into the first analog error signal, and the first DAC may be connected in parallel with the second DAC.

The delay elements may include D flip-flops configured to delay the transmission of the first digital error signal based on the clock signal.

A continuous time modulator may include: the digital noise coupling circuit; an adder configured to add an input analog signal and a feedback analog signal; a loop filter configured to generate a third analog signal obtained by filtering a signal received from the adder; a sampling circuit configured to generate a fourth analog signal comprising a discontinuous analog signal by sampling the third analog signal based on a frequency of an operating signal; and a feedback digital-to-analog converter (DAC) configured to convert a noise-shaped signal, generated by the noise shaping performed on the first digital error signal, into the feedback analog signal and to feed back the feedback analog signal to the adder.

In one or more general aspects, a continuous time modulator includes: an adder configured to add an input analog signal and a feedback analog signal; a loop filter configured to generate a third analog signal obtained by filtering a signal received from the adder; a sampling circuit configured to generate a fourth analog signal comprising a discontinuous analog signal by sampling the third analog signal based on a frequency of an operating signal; a digital noise coupling circuit configured to convert a quantization error generated in a process of converting the fourth analog signal into a first digital signal into a first digital error signal and to perform, in an analog domain, noise shaping on the first digital error signal; and a feedback digital-to-analog converter (DAC) configured to convert a noise-shaped signal, generated by the noise shaping performed on the first digital error signal, into the feedback analog signal and to feed back the feedback analog signal to the adder.

The digital noise coupling circuit may include: a main analog-to-digital converter (ADC) configured to convert the fourth analog signal into the first digital signal; a noise coupling ADC (NC-ADC) configured to convert the quantization error into the first digital error signal; a delay cell comprising delay elements configured to delay a transmission of the first digital error signal based on a clock signal generated by the main ADC; and a digital-to-analog (DA) conversion circuit configured to perform noise shaping on the first digital error signal that is delayed in the analog domain.

The DA conversion circuit may include: a first DAC configured to convert the first digital error signal that is delayed into a first analog error signal for feedback to the NC-ADC; a second DAC configured to convert a result of performing the noise shaping on the first digital error signal that is delayed into a third analog signal; and an adder configured to add a difference between the feedback analog signal and the third analog signal.

The DA conversion circuit may be configured to convert a signal obtained by attenuating signal components having frequencies less than or equal to a reference frequency among signal components comprised in the first digital error signal that is delayed into the third analog signal through an analog addition of a charge domain.

The DA conversion circuit may be implemented by a capacitive digital-to-analog converter (CDAC) configured to generate a second analog output voltage corresponding to the first digital error signal that is delayed, by performing the noise shaping through charge redistribution by capacitors connected to all bits from a most significant bit (MSB) to a least significant bit (LSB) of the first digital error signal that is delayed, according to a control voltage.

The DA conversion circuit may be configured to perform the noise shaping through the charge redistribution by the capacitors that are charged or discharged by switches that switch each of the capacitors based on the control voltage and a transfer function having a characteristic of a high-order high-pass filter.

The DA conversion circuit may include: a first noise coupling DAC block comprising a first group of switches and a first group of capacitors connected to a reference node; a second noise coupling DAC block comprising a second group of switches and a second group of capacitors connected to the reference node, and a third group of switches and a third group of capacitors connected to the reference node; a comparator configured to generate a comparison result by comparing a level of a voltage formed at the reference node to which the first group of capacitors, the second group of capacitors, and the third group of capacitors are connected with a level of a reference voltage; a logic circuit configured to generate a control signal such that a switch block comprising the first group of switches, the second group of switches, and the third group of switches connects each of the first group of capacitors, the second group of capacitors, and the third group of capacitors to one of a terminal of a non-inverting voltage and a terminal of an inverting voltage, based on the transfer function; and a sampler configured to sample a signal corresponding to the reference node based on the control signal of the logic circuit.

The logic circuit may be configured to generate the control signal to control the first group of switches, the second group of switches, and the third group of switches based on the comparison result received from the comparator.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms used herein including technical or scientific terms have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Hereinafter, examples will be described in detail with reference to the accompanying drawings. When describing the example embodiments with reference to the accompanying drawings, like reference numerals refer to like elements and any repeated description related thereto will be omitted.

Figure 1:
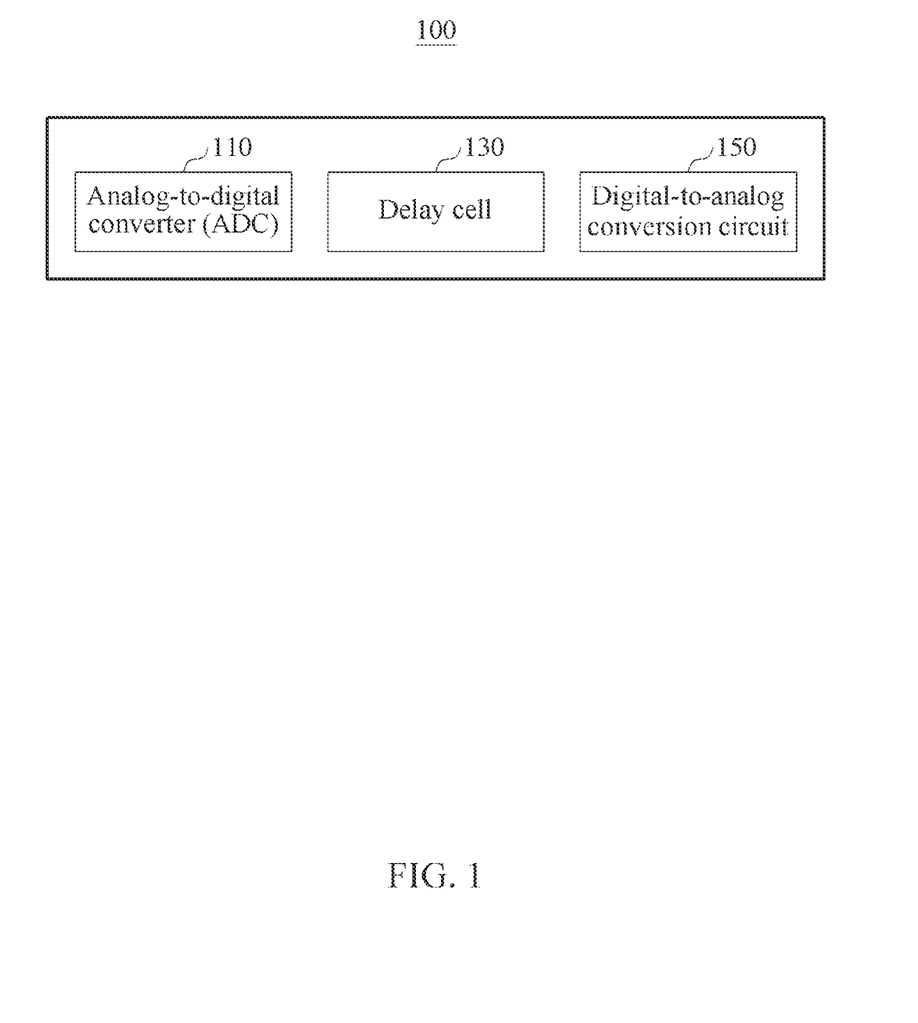
FIG. 1 illustrates an example of a digital noise coupling circuit.

FIG. 1 illustrates an example of a digital noise coupling circuit. Referring to FIG. 1, a digital noise coupling circuit 100 includes an analog-to-digital converter (ADC) 110, a delay cell 130, and a digital-to-analog (DA) conversion circuit 150.

For example, when a digital filter is used for digital noise coupling, a quantization process of converting an analog signal into a digital signal by an ADC may be preceded. In this quantization process, a quantization error may occur. The "quantization error" described herein may mean an error that occurs when the analog signal is converted into the digital signal. The quantization error may correspond to a difference between a level of the analog signal before being converted into the digital signal and a data value of the digital signal after being converted. Here, the expression "difference" may be understood to mean a conceptual difference rather than an arithmetic difference. For example, the quantization error may correspond to an error occurring when an actually received analog signal having a value of "11.2" is sampled with a digital signal of 11 and an actually received analog signal having a value of "3.7" is sampled with a digital signal of 4.

The ADC 110 may convert a quantization error $E_{Q1}$ generated in a process of converting a first analog signal into a first digital signal into a first digital error signal. As such, the quantization error $E_{Q1}$ may be first converted into a digital code before being injected into the delay cell 130. The ADC 110 may be or include, for example, a noise coupling ADC (NC-ADC) that performs noise coupling, but is not necessarily limited thereto.

For example, the ADC 110 may have a characteristic of a high-frequency band pass filter that attenuates a signal of a frequency less than or equal to a certain cutoff frequency and passes only a signal of a frequency greater than or equal to the cutoff frequency. In this case, a quantization error $E_{Q2}$ may be a difference between a representative value of an input signal converted to the digital code and an actual analog input value.

The delay cell 130 may delay a transmission of the first digital error signal output from the ADC 110 based on a clock signal. In this case, the clock signal may be, for example, generated by a main ADC 250 of FIG. 2, but examples are not necessarily limited thereto.

The delay cell 130 may include, for example, delay elements that delay the transmission of the first digital error signal based on the clock signal. The delay elements may be or include, for example, a D flip-flop that stores or maintains 1-bit information according to a clock, but is not necessarily limited thereto.

Figure 2:
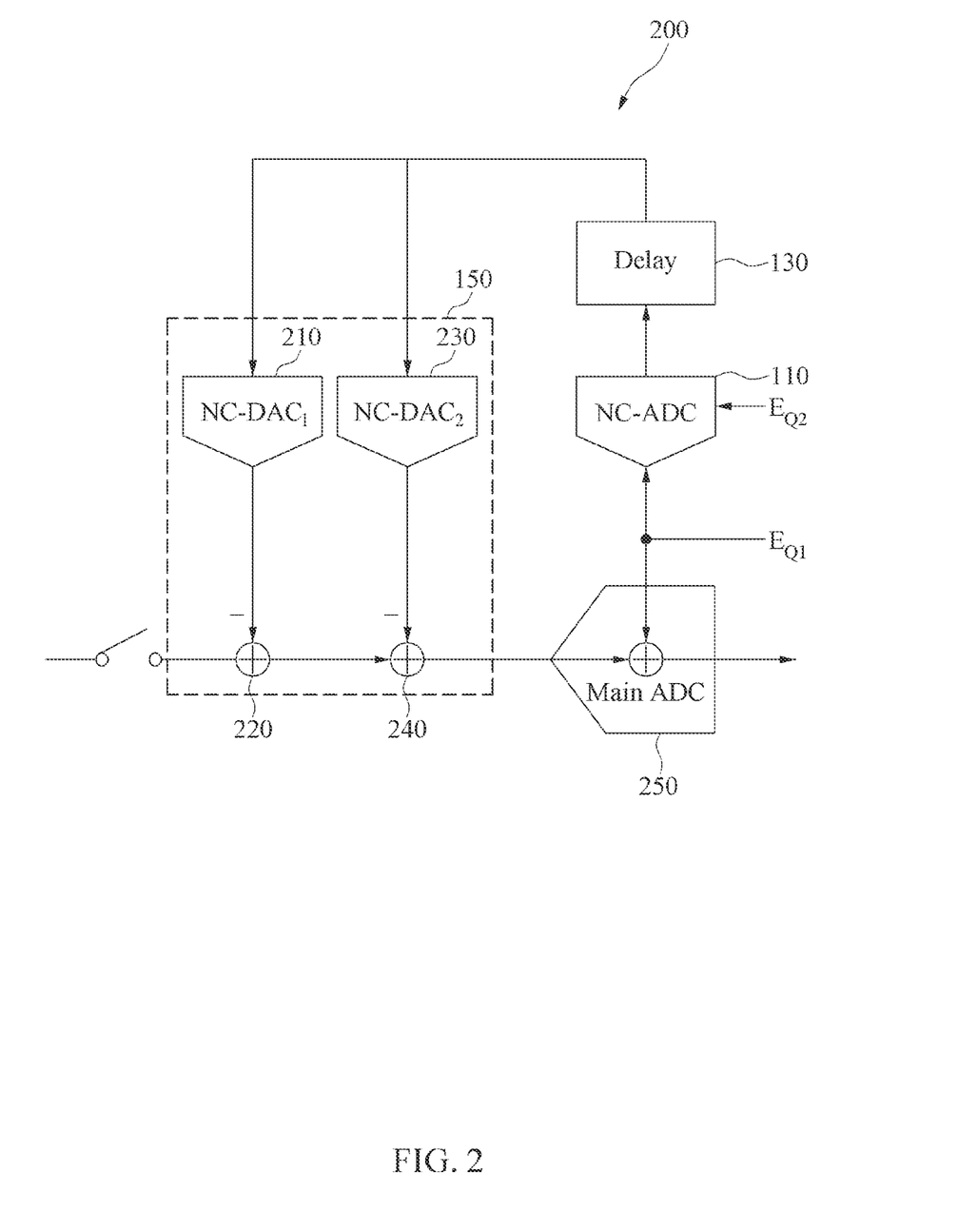
FIG. 2 illustrates an example of a connection relationship and operation of a digital-to-analog (DA) conversion circuit in a digital noise coupling circuit.

As an output of the delay cell 130 is directly fed back to the DA conversion circuit 150, e.g., to a second noise coupling DAC (NC-DAC 2) 230 of FIG. 2, the time delay may be reduced and the processing speed of the digital noise coupling circuit 100 may be improved. A non-limiting example of a configuration and operation of the delay cell 130 will be described with reference to FIG. 3 below.

The DA conversion circuit 150 may perform noise shaping to the first digital error signal that is delayed and transmitted by the delay cell 130 in an analog domain. The DA conversion circuit 150, for example, may convert a signal that attenuates signal components having frequencies less than or equal to a reference frequency among signal components included in the first digital error signal that is delayed in the delay cell 130 into a third analog signal, through an analog addition in a charge domain. A non-limiting example of a configuration and operation of the DA conversion circuit 150 will be described in detail with reference to FIG. 2 below.

The digital noise coupling circuit 100, for example, converts the quantization error $E_{Q1}$ generated in a process of converting a fourth analog signal S3 generated by a sampling circuit 550, which will be described later in FIG. 5, into a first digital signal into a first digital error signal and performs noise shaping in the analog domain.

A noise-shaped signal $D_{out}$ output from the digital noise coupling circuit 100 may be a digital signal. The digital noise coupling circuit 100 may include, for example, a filter (e.g., a DA conversion circuit) operating in the analog domain to perform the noise shaping.

The DA conversion circuit 150 may be implemented by or include, for example, a capacitive digital-to-analog converter (CDAC). The CDAC may generate a second analog output voltage corresponding to the first digital error signal that is delayed, by performing the noise shaping through charge redistribution by capacitors connected to all bits from a most significant bit (MSB) to a least significant bit (LSB) of the first digital error signal that is delayed, according to a control voltage.

The DA conversion circuit 150 may perform, for example, the noise shaping through the charge redistribution by the capacitors that are charged or discharged by switches that switch each of the capacitors based on a transfer function $H_D$ having a characteristic of the control voltage and a high-order high-frequency band pass filter. In this case, the switches may correspond to, for example, capacitor leg switches that directly compensate by balancing a voltage imbalance of the capacitors, but is not necessarily limited thereto. The transfer function H D may include, for example, at least one of a characteristic of a second-order high-frequency band pass filter and a characteristic of a third-order high-frequency band pass filter, but is not necessarily limited thereto.

A non-limiting example of a method in which the DA conversion circuit 150 performs an analog addition of a charge domain by the CDAC will be described in detail with reference to FIG. 4 below.

FIG. 2 illustrates an example of a connection relationship and operation of a DA conversion circuit in a digital noise coupling circuit.

Referring to FIG. 2, a digital noise coupling circuit 200 may include the ADC 110, the delay cell 130, the DA conversion circuit 150, and the main ADC 250.

The DA conversion circuit 150 may include, for example, a first DAC (NC-DACi) 210, a first adder 220, and a second DAC (NC-DAC 2) 230, and a second adder 240.

The first DAC 210 may convert the first digital error signal that is delayed and transmitted from the delay cell 130 into a first analog error signal for feedback to the ADC 110 performing noise coupling. The first analog error signal may be output to the first adder 220 connected in series with the first DAC 210. The first DAC 210 may be connected in parallel with the second DAC 230.

The first adder 220 may subtract the first analog error signal output from the first DAC 210 from the analog signal (e.g., the fourth analog signal S3) transmitted through a sampling circuit (e.g., the sampling circuit 550 of FIG. 5) and transmit a signal corresponding to the subtracted result to the second adder 240.

The second DAC 230 may perform noise shaping on the first digital error signal that is delayed and transmitted by the delay cell 130 and convert the first digital error signal that is noise shaped into a second analog signal. Here, the "noise shaping" may correspond to a technique used in a digital audio, an image, and video processing, e.g., together with dithering, as part of a quantization or bit-depth reduction process of a digital signal. The noise shaping may improve resolution during AD conversion or DA conversion by increasing an apparent signal-to-noise ratio of a resulting signal.

The second DAC 230 may output the second analog signal to the second adder 240 connected in series with the second DAC 230.

The second adder 240 may subtract the second analog signal noise-shaped by the second DAC 230 from the signal corresponding to the subtracted result transmitted from the first adder 220 and transmit a signal (e.g., the first analog signal) corresponding to the subtracted result to the main ADC 250.

The main ADC 250 may convert an analog signal (e.g., the first analog signal) received from the second adder 240 into a digital signal (e.g., the first digital signal).

The quantization error $E_{Q1}$ generated in a process of converting the first analog signal into the first digital signal in the main ADC 250 may be converted into the first digital error signal by inputting the quantization error $E_{Q1}$ to the ADC 110 and may be applied again to the first DAC 210 and the second DAC 230 of the DA conversion circuit 150 via the first digital error signal that is delayed and transmitted by the delay cell 130.

Figure 3:
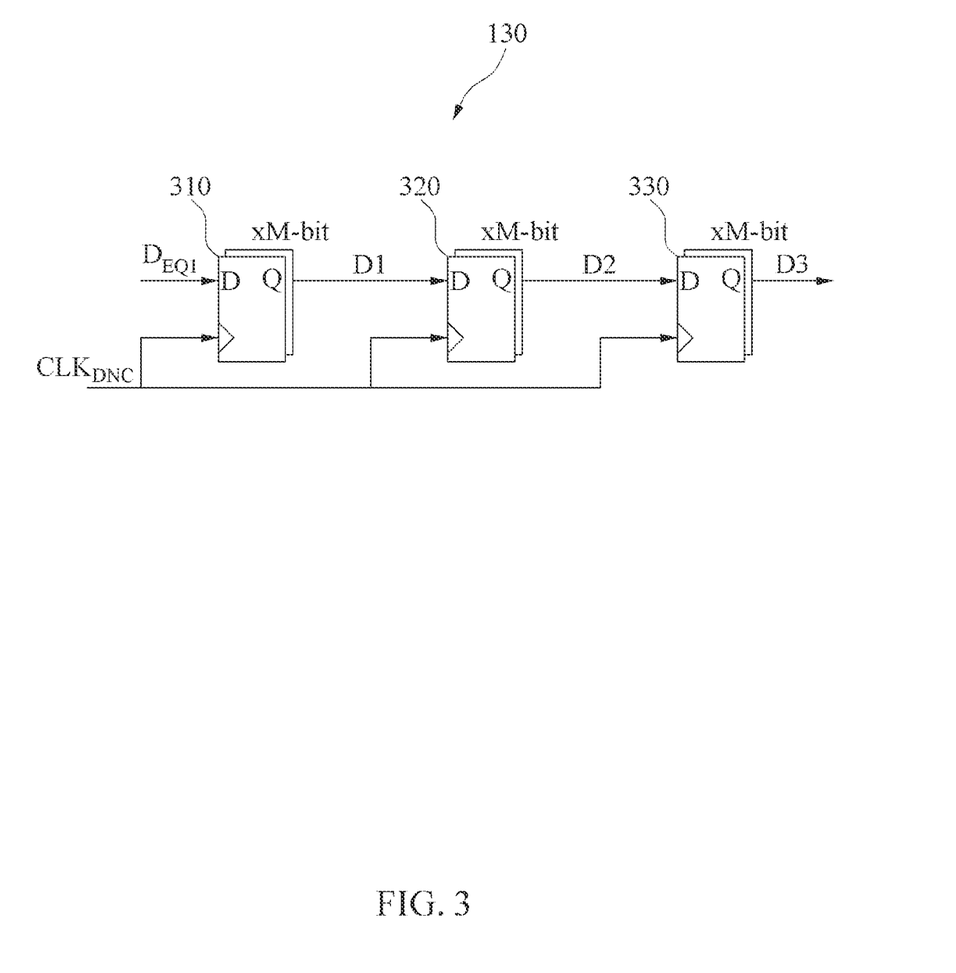
FIG. 3 illustrates an example of a configuration of a delay cell of a digital noise coupling circuit.

FIG. 3 illustrates an example of a configuration of a delay cell of a digital noise coupling circuit. Referring to FIG. 3, a configuration of the delay cell 130 of the digital noise coupling circuit according to an example is illustrated.

The delay cell 130 may include delay elements 310, 320, and 330 that delay a transmission of a digital signal (e.g., a first digital error signal $D_{EQ1}$) converted in the ADC 110 based on a clock signal. The delay elements 310, 320, and 330 may be, for example, D flip-flops that store or maintains 1-bit information by a predetermined clock according to a clock as shown in FIG. 3, but examples are not necessarily limited thereto. The delay elements 310, 320, and 330 may be, for example, latches that do not include the clock.

Each of the delay elements 310, 320, and 330 may implement, for example, a certain operation of $z^{-1}$.

For example, the first delay element 310 may delay the digital signal $D_{EQ1}$ converted by the ADC 110 by 1 clock. In a transfer function $H_D$ described later, $z^{-1}$ means a delay of 1 clock, and may be implemented by the first delay element 310. $z^{-1}$ may be expressed as "D1".

The second delay element 320 may delay the digital signal $D_{EQ1}$ delayed by 1 clock by the first delay element 310 by 1 clock again, that is, by a total of 2 clocks. In the transfer function $H_D$, $z^{-2}$ means a delay of 2 clocks, and may be implemented by the first delay element 310 and the second delay element 320. $z^{-2}$ may be expressed "D2".

The third delay element 330 may delay the digital signal $D_{EQ1}$ delayed by 2 clocks by the second delay element 320 by 1 clock again, that is, by a total of 3 clocks. In the transfer function $H_D$, $z^{-3}$ means a delay of 3 clocks, and may be implemented by the first delay element 310, the second delay element 320, and the third delay element 330. $z^{-3}$ may be expressed as "D3".

Figure 4:
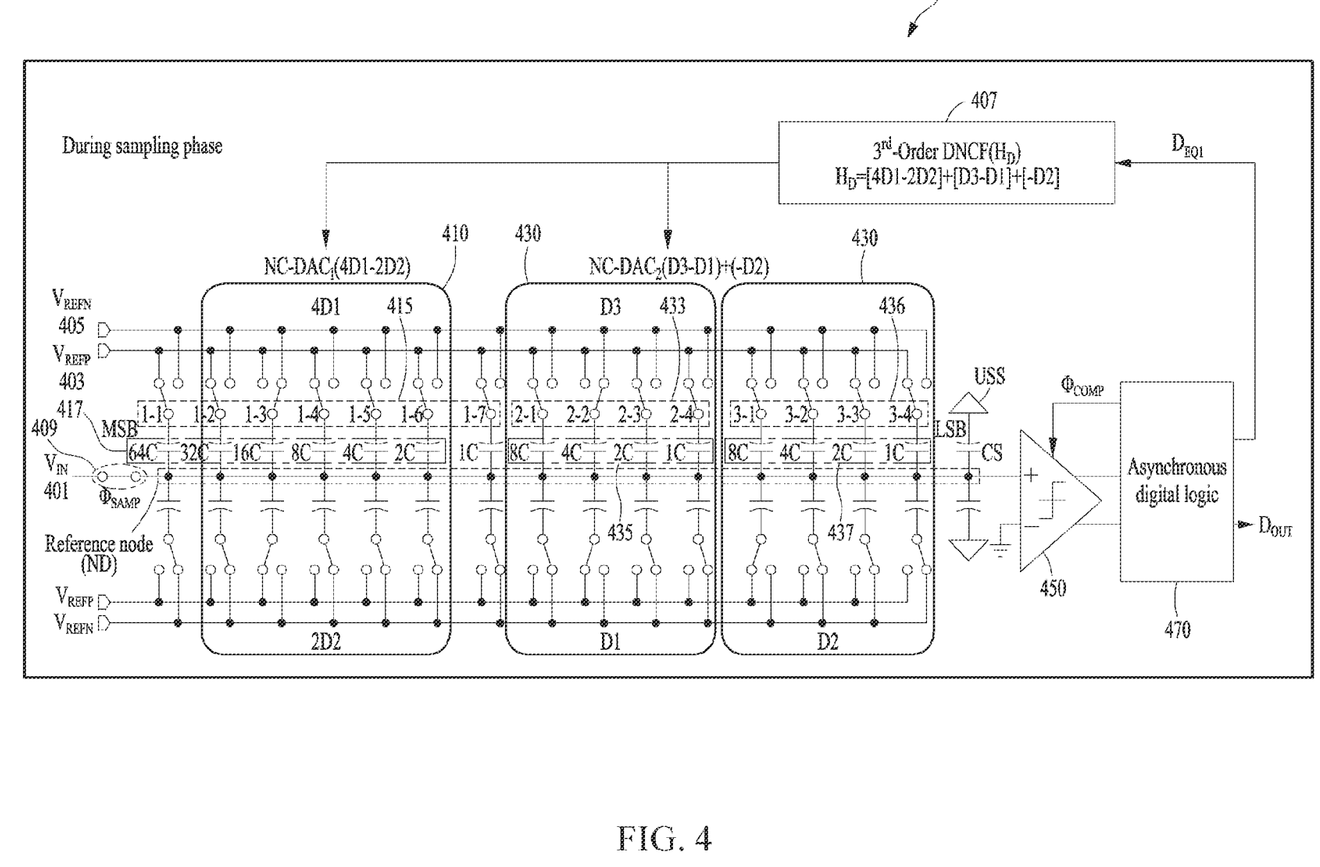
FIG. 4 illustrates an example of a configuration of a DA conversion circuit.

FIG. 4 illustrates an example of a configuration of a DA conversion circuit. Referring to FIG. 4, an operation in a sampling phase of the DA conversion circuit 150 implemented by the CDAC according to an example is shown.

As described above, the DA conversion circuit 150 implemented by the CDAC may generate a second analog output voltage corresponding to a first digital error signal that is delayed by performing noise shaping through charge redistribution by capacitors connected to all bits from the MSB to the LSB of the first digital error signal that is delayed, according to a control voltage.

The DA conversion circuit 150 may perform the noise shaping through the charge redistribution by the capacitors that are charged or discharged by switches that switch each of the capacitors based on the control voltage and a transfer function $H_D$ 407 having a characteristic of a high-order high-frequency band pass filter.

The DA conversion circuit 150 implemented by the CDAC may include, for example, a sampler 409, a first noise coupling DAC block 410, a second noise coupling DAC block 430, a comparator 450, and a logic circuit 470.

The sampler 409 may sample a signal corresponding to a reference node based on a control signal of the logic circuit 470. For example, the sampler 409 may sample the signal corresponding to the reference node according to a sampling frequency $\Phi_{SAMP}$ based on the control signal of the logic circuit 470.

The first noise coupling DAC block 410 may perform an operation corresponding to, and may be included in, the first DAC 210 described above with reference to FIG. 2. The first noise coupling DAC block 410 may convert a digital signal sampled by the sampler 409 into an analog signal.

The first noise coupling DAC block 410 may include, for example, a first group of switches SW1-1 to SW1-7 415 and a first group of capacitors C1-1 to C1-7 417 connected to a reference node ND. The first group of capacitors C1-1 to C1-7 417 may include, for example, a 7-bit capacitor array including a binary weight value and one dummy LSB capacitor C1-7. The first group of capacitors C1-1 to C1-7 417 may correspond to the first group of switches SW1-1 to SW1-7 415. For example, the capacitor C1-1 may correspond to the switch SW1-1 and the capacitor C1-7 may correspond to the switch SW1-7.

The second noise coupling DAC block 430 may perform an operation corresponding to, and may be included in, the second DAC 230 described above with reference to FIG. 2. The second noise coupling DAC block 430 may include, for example, a second group of switches SW2-1 to SW2-4 433 and a second group of capacitors C2-1 to C2-4 435 connected to the reference node ND, and a third group of switches SW3-1 to SW3-4 436 and a third group of capacitors C3-1 to C3 437 connected to the reference node ND.

The second group of capacitors C2-1 to C2-4 435 may include, for example, a 4-bit capacitor array and correspond to the second group of switches SW2-1 to SW2-4 433. For example, the capacitor C2-1 may correspond to the switch SW2-1 and the capacitor C2-4 may correspond to the switch SW2-4.

In addition, the third group of capacitors C3-1 to C3-4 437 may include, for example, a 4-bit capacitor array and correspond to the third group of switches SW3-1 to SW3-4 436. For example, the capacitor C3-1 may correspond to the switch SW3-1 and the capacitor C3-4 may correspond to the switch SW3-4.

For example, when a switch of a corresponding position in the first group of switches SW1-1 to SW1-7 415, the second group of switches SW2-1 to SW2-4 433, and the third group of switches SW3-1 to SW3-4 436 is turned on, a reference voltage may be applied to capacitors in a position corresponding to the "on" switch.

The first noise coupling DAC block 410 and the second noise coupling DAC block 430 may use, for example, successive approximation analog-to-digital (AD) conversion performing quantization corresponding to each bit with a binary search method.

The first noise coupling DAC block 410 and the second noise coupling DAC block 430 may perform DA conversion one bit per clock from the MSB to the LSB. At this time, an upper part of the reference node ND in the first noise coupling DAC block 410 and the second noise coupling DAC block 430 may correspond to 4D1 and D3, which are + terms (+ input terminals) of the transfer function, and a lower part of the reference node ND may correspond to 2D2, D1, and D2, which are − terms of the transfer function.

In the first noise coupling DAC block 410 and the second noise coupling DAC block 430, capacitors connected symmetrically up and down with respect to the + input terminal of the comparator may be connected to different reference voltages during initialization. For example, upper capacitors may all be connected to $V_{REFP}$ and lower capacitors may all be connected to $V_{REFN}$. Subsequently, when the NC-DAC moves to increase a voltage of the + input terminal, only a corresponding lower capacitor may be switched to $V_{REFP}$ and an upper capacitor may not move. Conversely, when the NC-DAC moves to reduce the voltage of the + input terminal, only a corresponding upper capacitor may be switched to $V_{REFN}$ and a lower capacitor may not move. This switching technique may vary depending on a configuration of a DAC of a corresponding capacitor, but the switching is not necessarily limited thereto.

The comparator 450 may generate a comparison result by comparing a level of a voltage formed at the reference node ND connected to the first group of capacitors 417, the second group of capacitors 435, and the third group of capacitors 437 with a level of a reference voltage $V_{REF}$. The reference voltage V REF may be divided into an inverting voltage $V_{REFN}$ 405 and a non-inverting voltage $V_{REFP}$ 403. The comparator 450 may generate a comparison result according to an operating signal $\Phi_{comp}$ transmitted from the logic circuit 470.

In this case, capacitors $C_S$ connected in parallel with the comparator 450 may be connected between the reference node ND and a voltage Vss terminal. The voltage Vss may be, for example, a ground voltage or a reference voltage. Alternatively, the voltage Vss may be a common mode voltage $V_{CM}$. As an example, the voltage Vss may be, for example, supplied from a voltage generator or voltage regulator disposed inside or outside the DA conversion circuit 150.

The logic circuit 470 may generate, for example, a control signal controlling the first group of switches 415, the second group of switches 433, and the third group of switches 436 based on the comparison result received from the comparator 450. The logic circuit 470 may generate, for example, a control signal asynchronously, but is not necessarily limited thereto.

The logic circuit 470 may generate a control signal such that a switch block including the first group of switches 415, the second group of switches 433, and the third group of switches 436 connects each of the first group of capacitors 417, the second group of capacitors 435, and the third group of capacitors 437 to one of a terminal of the non-inverting voltage $V_{REFP}$ 403 or a terminal of the inverting voltage $V_{REFN}$, based on the transfer function $H_D$ 407. The non-inverting voltage $V_{REFP}$ 403 may correspond to, for example, a logic value "1". The inverting voltage $V_{REFN}$ 405 may correspond to a logic value "0". A reference voltage $V_{IN}$ 401 may correspond to, for example, the common mode voltage $V_{CM}$ that does not indicate a logic value but is not necessarily limited thereto.

The logic circuit 470 may generate, for example, a clock for operations of the first noise coupling DAC block 410, the second noise coupling DAC block 430, the comparator 450, the sampler 409, and the logic circuit 470 itself. The logic circuit 470 may output a signal $D_{out}$ representing certain data based on the comparison result received from the comparator 450 and the clock.

For example, when a level of the non-inverting voltage $V_{REFP}$ 403 received from a non-inverting terminal is greater than a level of the inverting voltage $V_{REFN}$ 405 received from a inverting terminal, the logic circuit 470 may generate data "1" based on the comparison result of the comparator 450. In contrast, when the level of the non-inverting voltage $V_{REFP}$ 403 received from the non-inverting terminal is less than or equal to the level of the inverting voltage $V_{REFN}$ 405 received from the inverting terminal, the logic circuit 470 may generate data "0" based on the comparison result of the comparator 450. The logic circuit 470 may output a signal $D_{out}$ representing data sequentially generated according to time based on a clock.

For example, in the case of third-order noise shaping, the transfer function $H_D$ may be $3z^{-1}-3z^{-2}+z^{-3}$. The transfer function $H_D$ for the third-order noise shaping may be modified as shown in Equation 1 below, for example.

$$H_D = 3z^{-1} - 3z^{-2} + z^{-3} = 4z^{-1} - z^{-1} - 2z^{-2} - z^{-2} + z^{-3} = \quad \text{Equation 1}$$
$$[4z^{-1} - 2z^{-2}] + [z^{-3} - z^{-1}] + [-z^{-2}]$$

In this case, $z^{-1}$, $z^{-2}$, and $z^{-3}$ may be implemented by a 1 clock delay, 2 clock delay, and 3 clock delay, respectively.

In Equation 1, the term $4z^{-1}-2z^{-2}$ of a front end may be implemented by the first noise coupling DAC block 410. A ratio of capacitances of the first group of capacitors C1-1 to C1-7 417 included in the first noise coupling DAC block 410 may be, for example, "64:32:16:8:4:2:1". The capacitances of the first group of capacitors C1-1 to C1-7 417 may respectively correspond to individual bits of data generated by the DA conversion circuit 150. The first group of capacitors C1-1 to C1-7 417 may be connected between the first group of switches SW1-1 to SW1-7 415 and the node ND. The first group of switches SW1-1 to SW1-7 415 may respectively correspond to individual bits of data to be output as a signal $D_{out}$. As an example, the first group of switches SW1-1 to SW1-7 415 may sequentially correspond to the next lower bit of the highest bit of data converted from the signal received by the main ADC 250, that is, the second upper bit connected to the switch SW1-2.

At this time, a gain of the term $4z^{-1}-2z^{-2}$ may be implemented simply with 2-bit shift and 1-bit shift operations, respectively, in the CDAC.

In addition, in Equation 1, the term $[z^{-3}-z^{-1}]+[-z^{-2}]$ of a rear end may be implemented by the second noise coupling DAC block 430. A ratio of the capacitances of each of the second group of capacitors C2-1 to C2-4 435 and the third group of capacitors C3-1 to C3-4 437 included in the second noise coupling DAC block 430 may be, for example, "8:4: 2:1".

For example, increasing the order of the transfer function in a digital noise coupling filter (DNCF) may help achieve higher resolution, but the propagation delay of the DNCF in high-speed applications may significantly limit bandwidth.

In an example, however, the digital noise coupling circuit of one or more embodiments may implement a high-speed and high-order DNCF without additional time delay by performing analog addition, by addition of a charge domain using the CDAC.

Figure 5:
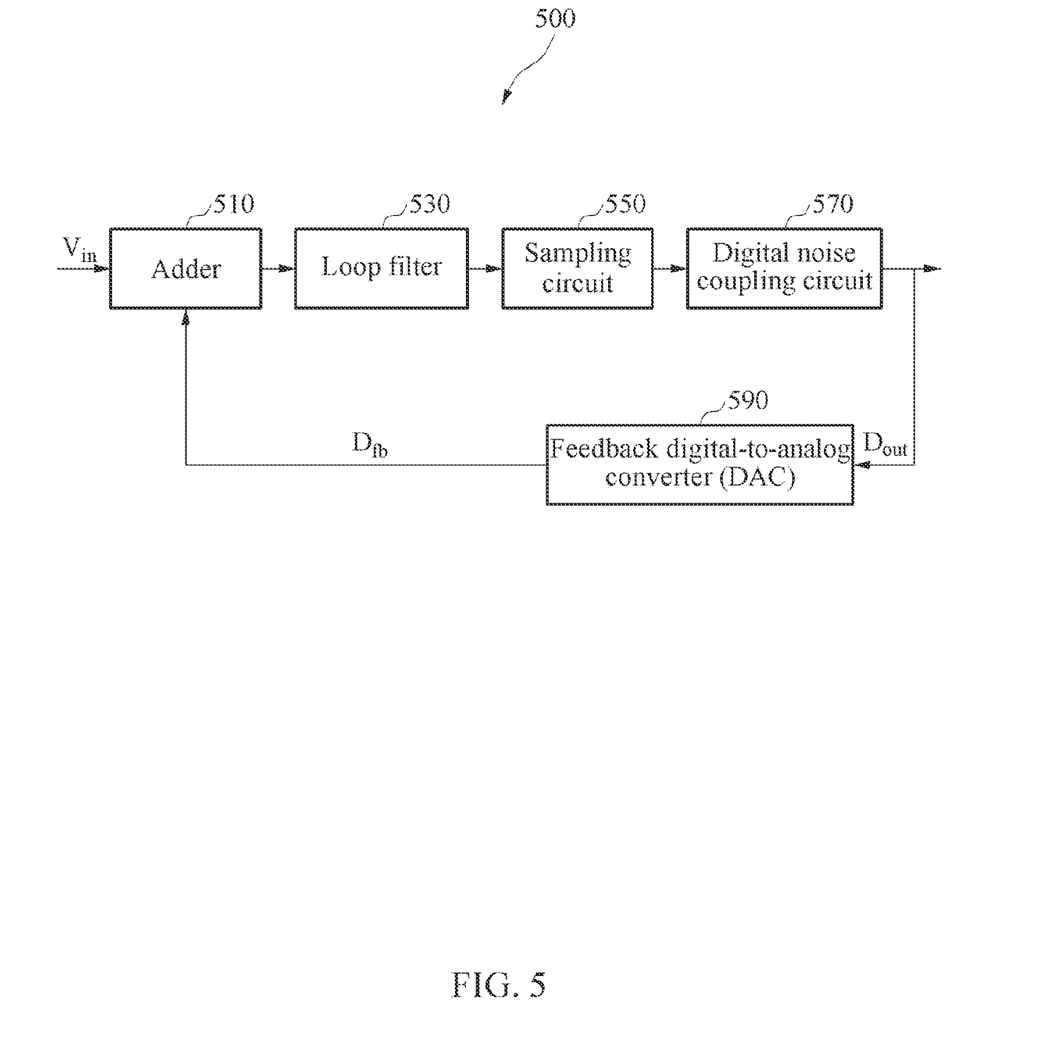
FIG. 5 illustrates an example of a continuous time modulator including a digital noise coupling circuit.
Figure 6:
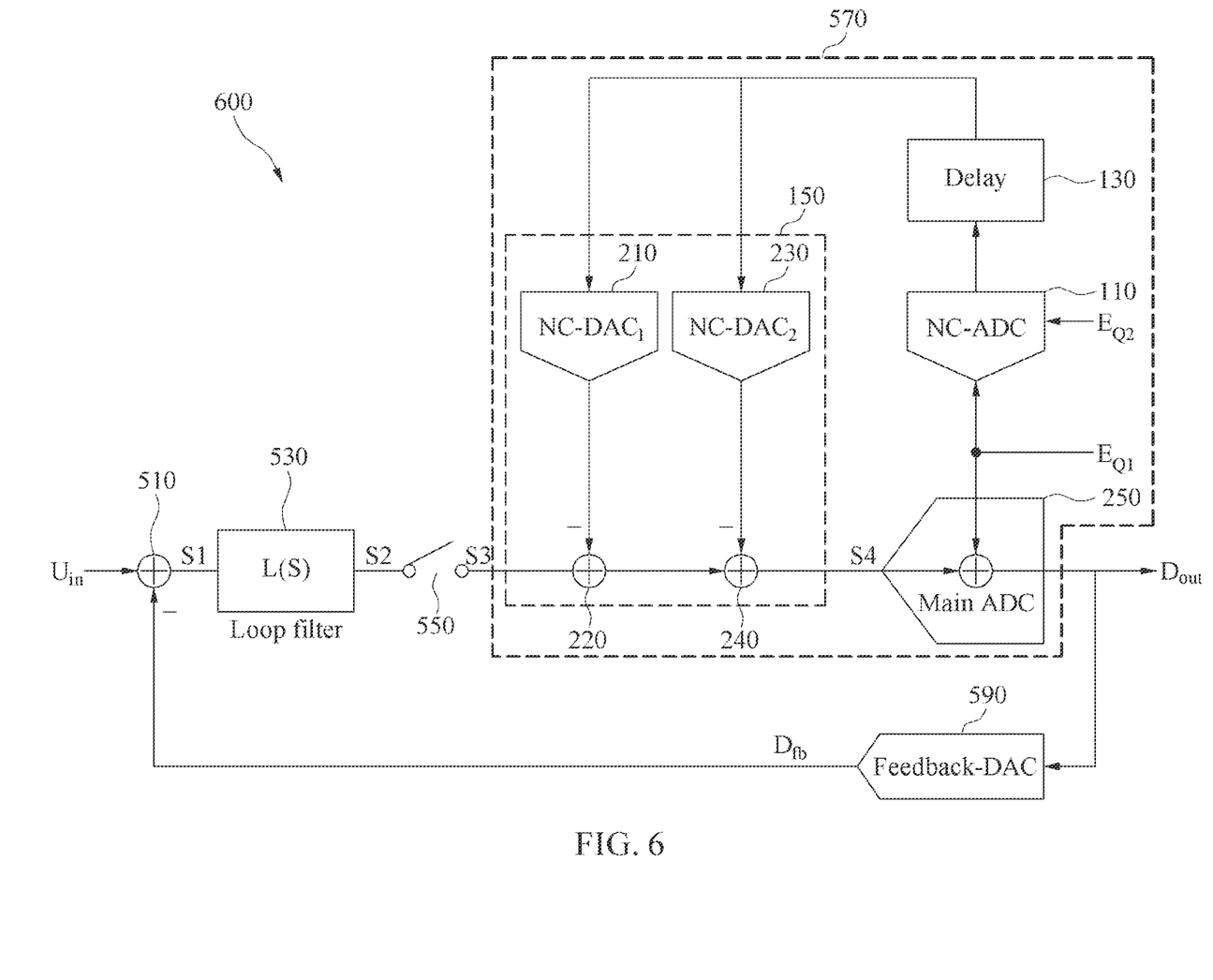
FIG. 6 illustrates an example of a connection relationship and operation of a digital noise coupling circuit in a continuous time modulator.

FIG. 5 illustrates an example of a continuous time modulator including a digital noise coupling circuit and FIG. 6 illustrates an example of a connection relationship and operation of a digital noise coupling circuit in a continuous time modulator.

Referring to FIGS. 5 and 6, a continuous time modulator 500 (e.g., a continuous time modulator 600) may include an adder 510, a loop filter 530, a sampling circuit 550, a digital noise coupling circuit 570, and a feedback DAC 590.

The continuous time modulator 500 may convert analog signals received by an electronic device into digital signals. The electronic device may be, for example, one of a personal computer (PC), a workstation, a notebook computer, a mobile terminal, and a mobile device. The electronic device may include various types of electronic circuits configured to process analog signals and digital signals. In a non-limiting example, the continuous time modulator 500 is the electronic device.

The adder 510 may receive, for example, an input analog signal $U_{in}$ input to the continuous time modulator 500 from other components of the electronic device. Also, the adder 510 may receive a feedback analog signal D in fed back from the feedback DAC 590.

The adder 510 may add the input analog signal $U_{in}$ input to the continuous time modulator 500 and the feedback analog signal Din fed back from the feedback DAC 590. The adder 510 may perform analog addition of a charge domain to two or more analog signals (e.g., the input analog signal $U_{in}$ and the feedback analog signal Din) in an analog domain. The adder 510 may generate, for example, a signal (e.g., S1) having a voltage level obtained by subtracting a voltage level of the feedback analog signal Din from a voltage level of the input analog signal $U_{in}$ and output the signal (e.g., S1) to the loop filter 530. In an example, it has been described that an addition operation between the voltage levels of the input analog signal and the feedback analog signal is performed, but examples are not necessarily limited thereto.

The loop filter 530 may generate a third analog signal S2 that filters the signal S1 received from the adder 510. The loop filter 530 may generate the third analog signal S2 by attenuating sizes of signal components having certain frequencies among signal components included in the signal S1. The loop filter 530 may include, for example, a high-pass filter. The loop filter 530 may attenuate sizes of signal components having frequencies greater than or equal to a reference frequency among the signal components included in the signal S1. The loop filter 530 may generate the third analog signal S2 by filtering the signal S1. The loop filter 530 may output the third analog signal S2 to the sampling circuit 550.

The sampling circuit 550 may generate a fourth analog signal S3 including a discontinuous analog signal by sampling the third analog signal S2 output from the loop filter 530 based on a frequency (e.g., fs) of an operating signal. Here, the operating signal, for example, may be received from a logic circuit included in the main ADC 250 of the digital noise coupling circuit 570.

Although the sampling circuit 550 is shown in the form of a switch element in FIG. 6, the examples are not necessarily limited thereto. For example, the sampling circuit 550 may be implemented with various hardware circuits (e.g., capacitors, flip-flops, etc.) configured to sample and hold the third analog signal S2 with the fourth analog signal S3 of the intended signal level.

The digital noise coupling circuit 570 may convert the quantization error $E_{Q1}$ generated in a process of converting the fourth analog signal S3 generated by the sampling circuit 550 into a first analog signal S4 into a first digital error signal and perform noise shaping to the first digital error signal in an analog domain. The noise-shaped signal D ont in the digital noise coupling circuit 570 may be a digital signal.

The digital noise coupling circuit 570 may include a filter (e.g., a DA conversion circuit) operating in the analog domain to perform the noise shaping.

Since the digital noise coupling circuit 570 may correspond to, for example, the above-described digital noise coupling circuit 100 including the main ADC 250, the NC-ADC (e.g., the NC-ADC of FIG. 1), the delay cell 130, and the DA conversion circuit 150, an operation different from that of the digital noise coupling circuit 100 will be mainly described below.

For example, as described above in FIG. 4, the digital noise coupling circuit 100 may be implemented by the CDAC that generates a second analog output voltage corresponding to the first digital error signal that is delayed by performing noise shaping through charge redistribution by capacitors connected to all bits from the MSB to LSB of the first digital error signal that is delayed, according to a control voltage.

The main ADC 250 may receive the signal S4 from the DA conversion circuit 150. The main ADC 250 may convert an analog signal into a digital signal. For example, the main ADC 250 may generate a signal $D_{out}$ by converting the signal S4. The main ADC 250 may output the signal $D_{out}$ to the outside of the continuous time modulator 500 based on a clock. Also, the main ADC 250 may output the signal $D_{out}$ to the feedback DAC 590 based on the clock.

The main ADC 250 may include a logic circuit for generating the clock. When the signal S4 is converted by the main ADC 250, a quantization error may occur. A level of the quantization error signal $E_{Q1}$ may represent a size of the quantization error generated when converting the signal S4 into the output signal $D_{out}$. The size of the quantization error represented by the quantization error signal $E_{Q1}$ may correspond to a difference between a level of the signal S4 and data value of the signal $D_{out}$.

The main ADC 250 may output the signal $E_{Q1}$ representing the quantization error to the feedback DAC 590 for noise shaping.

The digital noise coupling circuit 570 may include electronic circuits configured in a topology based on noise coupling. The digital noise coupling circuit 570 may output the noise-shaped signal $D_{out}$ to the outside of the continuous time modulator 500. For example, the digital noise coupling circuit 570 may output the noise-shaped signal $D_{out}$ to other components of the electronic device including the continuous time modulator 500. The noise-shaped signal $D_{out}$ may be used to operate the electronic device. The digital noise coupling circuit 570 may output the noise-shaped signal $D_{out}$ to the feedback DAC 590.

The feedback DAC 590 may convert the noise-shaped signal $D_{out}$, which is a digital signal received from the digital noise coupling circuit 570, into an analog signal, and may feed back the analog signal as the feedback analog signal $D_{fb}$ to the adder 510.

As a level of a signal (e.g., the feedback analog signal $D_{fb}$) fed back by the adder 510 is subtracted from a level of an input signal (e.g., the input analog signal $U_{in}$) input to the continuous time modulator 500, the signal S1 having a difference value between the level of the feedback analog signal Dib and the level of the input analog signal $U_{in}$ as a level may be generated.

The signal S1 generated based on the feedback analog signal Dib may be converted into a signal $D_{out}$ through the loop filter 530, the sampling circuit 550, and the digital noise coupling circuit 570. As the feedback analog signal $D_{fb}$ converted from the digital signal $D_{out}$ through the feedback DAC 590 is continuously fed back, a difference between a level of the input analog signal $U_{in}$ of the continuous time modulator 500 and a data value of the output signal $D_{out}$ of the continuous time modulator 500 is continuously converted into the output signal $D_{out}$, and the difference between the level of the input analog signal $U_{in}$ and the data value of the output signal $D_{out}$ may converge to "0".

In this way, the data of the output signal $D_{out}$ of the continuous time modulator 500 may accurately represent the level of the input analog signal $U_{in}$ by a feedback path formed by the feedback DAC 590.

The quantization noise generated by the main ADC 250 may first be converted into a digital code before being supplied to the DA conversion circuit 150. An output of the DA conversion circuit 150 may be injected into the DA conversion circuit 150 and subtracted by the input of the main DAC 250.

According to examples, a digital noise coupling circuit and a continuous time modulator of one or more embodiments may, by replacing a digital addition operation with an analog addition operation in a charge domain, efficiently implement a high-order delta-sigma modulator including a high-speed DNCF having a higher resolution and lower power consumption and efficiently implement a DNCF. The digital noise coupling circuit and the continuous time modulator of one or more embodiments may include a high-resolution ADC/DAC constructed to be disposed in a small area and consume low power.

The apparatuses, devices, and components described and disclosed herein with respect to FIGS. 1-6 are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:
1. A digital noise coupling circuit comprising:
an analog-to-digital converter (ADC) configured to convert a quantization error, generated in a process of converting a first analog signal into a first digital signal, into a first digital error signal;

a delay cell comprising delay elements configured to delay a transmission of the first digital error signal based on a clock signal; and a digital-to-analog (DA) conversion circuit configured to convert a result of performing, in an analog domain, noise shaping on the first digital error signal that is delayed and transmitted from the delay cell into a second analog signal, and convert the first digital error signal that is delayed into a first analog error signal.

2. The digital noise coupling circuit of claim 1, wherein the DA conversion circuit comprises:

a second digital-to-analog converter (DAC) configured to convert the result of performing the noise shaping on the first digital error signal that is delayed and transmitted from the delay cell into the second analog signal; and an adder configured to add a difference between the second analog signal and the first analog error signal.

3. The digital noise coupling circuit of claim 2, wherein the DA conversion circuit is configured to convert a signal obtained by attenuating signal components having frequencies less than or equal to a reference frequency among signal components comprised in the first digital error signal that is delayed into the second analog signal through an analog addition of a charge domain.

4. The digital noise coupling circuit of claim 2, wherein the DA conversion circuit is implemented by a capacitive digital-to-analog converter (CDAC) configured to generate a second analog output voltage corresponding to the first digital error signal that is delayed, by performing the noise shaping through charge redistribution by capacitors connected to all bits from a most significant bit (MSB) to a least significant bit (LSB) of the first digital error signal that is delayed, according to a control voltage.

5. The digital noise coupling circuit of claim 4, wherein the DA conversion circuit is configured to perform the noise shaping through the charge redistribution by the capacitors that are charged or discharged by switches that switch each of the capacitors based on the control voltage and a transfer function having a characteristic of a high-order high pass filter.

6. The digital noise coupling circuit of claim 5, wherein the transfer function comprises either one or both of a characteristic of a second-order high pass filter and a characteristic of a third-order high pass filter.

7. The digital noise coupling circuit of claim 5, wherein the DA conversion circuit comprises:

a first noise coupling DAC block comprising a first group of switches and a first group of capacitors connected to a reference node;

a second noise coupling DAC block comprising a second group of switches and a second group of capacitors connected to the reference node, and a third group of switches and a third group of capacitors connected to the reference node;

a comparator configured to generate a comparison result by comparing a level of a voltage formed at the reference node to which the first group of capacitors, the second group of capacitors, and the third group of capacitors are connected with a level of a reference voltage;

a logic circuit configured to generate a control signal such that a switch block comprising the first group of switches, the second group of switches, and the third group of switches connects each of the first group of capacitors, the second group of capacitors, and the third group of capacitors to one of a terminal of a non-inverting voltage and a terminal of an inverting voltage, based on the transfer function; and a sampler configured to sample a signal corresponding to the reference node based on the control signal of the logic circuit.

8. The digital noise coupling circuit of claim 7, wherein the logic circuit is configured to generate a control signal to control the first group of switches, the second group of switches, and the third group of switches based on the comparison result received from the comparator.

9. The digital noise coupling circuit of claim 7, wherein the logic circuit is configured to output a signal representing predetermined data based on a clock and the comparison result received from the comparator.

10. The digital noise coupling circuit of claim 7, wherein a ratio of capacitances of the first group of capacitors is 64:32:16:8:4:2:1, and a ratio of capacitances of each of the second group of capacitors and the third group of capacitors is 8:4:2:1.

11. The digital noise coupling circuit of claim 2, wherein the DA conversion circuit further comprises a first DAC configured to convert the first digital error signal that is delayed into the first analog error signal, and the first DAC is connected in parallel with the second DAC.

12. The digital noise coupling circuit of claim 1, wherein the delay elements comprise D flip-flops configured to delay the transmission of the first digital error signal based on the clock signal.

13. A continuous time modulator comprising:

the digital noise coupling circuit of claim 1;

an adder configured to add an input analog signal and a feedback analog signal;

a loop filter configured to generate a third analog signal obtained by filtering a signal received from the adder;

a sampling circuit configured to generate a fourth analog signal comprising a discontinuous analog signal by sampling the third analog signal based on a frequency of an operating signal; and a feedback digital-to-analog converter (DAC) configured to convert a noise-shaped signal, generated by the noise shaping performed on the first digital error signal, into the feedback analog signal and to feed back the feedback analog signal to the adder.

14. A continuous time modulator comprising:

an adder configured to add an input analog signal and a feedback analog signal;

a loop filter configured to generate a third analog signal obtained by filtering a signal received from the adder;

a sampling circuit configured to generate a fourth analog signal comprising a discontinuous analog signal by sampling the third analog signal based on a frequency of an operating signal;

a digital noise coupling circuit configured to convert a quantization error generated in a process of converting the fourth analog signal into a first digital signal into a first digital error signal, to convert a result of performing, in an analog domain, noise shaping on the first digital error signal into a second analog signal, and to convert the first digital error signal that is delayed into a first analog error signal; and a feedback digital-to-analog converter (DAC) configured to convert a noise-shaped signal, generated by the noise shaping performed on the first digital error signal, into the feedback analog signal and to feed back the feedback analog signal to the adder.

15. The continuous time modulator of claim 14, wherein the digital noise coupling circuit comprises:
- a main analog-to-digital converter (ADC) configured to convert the fourth analog signal into the first digital signal;
- a noise coupling ADC (NC-ADC) configured to convert the quantization error into the first digital error signal;
- a delay cell comprising delay elements configured to delay a transmission of the first digital error signal based on a clock signal generated by the main ADC; and
- a digital-to-analog (DA) conversion circuit configured to perform noise shaping on the first digital error signal that is delayed in the analog domain.

16. The continuous time modulator of claim 15, wherein the DA conversion circuit comprises:
- a first DAC configured to convert the first digital error signal that is delayed into the first analog error signal for feedback to the NC-ADC;
- a second DAC configured to convert a result of performing the noise shaping on the first digital error signal that is delayed into a third analog signal; and
- an adder configured to add a difference between the feedback analog signal and the third analog signal.

17. The continuous time modulator of claim 16, wherein the DA conversion circuit is configured to convert a signal obtained by attenuating signal components having frequencies less than or equal to a reference frequency among signal components comprised in the first digital error signal that is delayed into the third analog signal through an analog addition of a charge domain.

18. The continuous time modulator of claim 16, wherein the DA conversion circuit is implemented by a capacitive digital-to-analog converter (CDAC) configured to generate a second analog output voltage corresponding to the first digital error signal that is delayed, by performing the noise shaping through charge redistribution by capacitors connected to all bits from a most significant bit (MSB) to a least significant bit (LSB) of the first digital error signal that is delayed, according to a control voltage.

19. The continuous time modulator of claim 18, wherein the DA conversion circuit is configured to perform the noise shaping through the charge redistribution by the capacitors that are charged or discharged by switches that switch each of the capacitors based on the control voltage and a transfer function having a characteristic of a high-order high-pass filter.

20. The continuous time modulator of claim 19, wherein the DA conversion circuit comprises:
- a first noise coupling DAC block comprising a first group of switches and a first group of capacitors connected to a reference node;
- a second noise coupling DAC block comprising a second group of switches and a second group of capacitors connected to the reference node, and a third group of switches and a third group of capacitors connected to the reference node;
- a comparator configured to generate a comparison result by comparing a level of a voltage formed at the reference node to which the first group of capacitors, the second group of capacitors, and the third group of capacitors are connected with a level of a reference voltage;
- a logic circuit configured to generate a control signal such that a switch block comprising the first group of switches, the second group of switches, and the third group of switches connects each of the first group of capacitors, the second group of capacitors, and the third group of capacitors to one of a terminal of a non-inverting voltage and a terminal of an inverting voltage, based on the transfer function; and
- a sampler configured to sample a signal corresponding to the reference node based on the control signal of the logic circuit.

21. The continuous time modulator of claim 20, wherein the logic circuit is configured to generate the control signal to control the first group of switches, the second group of switches, and the third group of switches based on the comparison result received from the comparator.

* * * * *